(12) United States Patent
Butler (10) Patent No.: US 10,778,160 B2
(45) Date of Patent: Sep. 15, 2020

(54) CLASS-D DYNAMIC CLOSED LOOP FEEDBACK AMPLIFIER

(71) Applicant: Dolby Laboratories Licensing Corporation, San Francisco, CA (US)

(72) Inventor: Joel A Butler, Springfield, MO (US)

(73) Assignee: Dolby Laboratories Licensing Corporation, San Francisco, CA (US)

(*) Notice: Subject to any disclaimer, the term of this patent is extended or adjusted under 35 U.S.C. 154(b) by 19 days.

(21) Appl. No.: 16/048,172

(22) Filed: Jul. 27, 2018

(65) Prior Publication Data

US 2020/0036348 A1 Jan. 30, 2020

Related U.S. Application Data

(63) Continuation-in-part of application No. PCT/US2017/015476, filed on Jan. 27, 2017.

(60) Provisional application No. 62/289,037, filed on Jan. 29, 2016, provisional application No. 62/429,682, filed on Dec. 2, 2016, provisional application No. (Continued)

(30) Foreign Application Priority Data

Jan. 29, 2016 (EP) .................................... 16153471

(51) Int. Cl.
*H03F 3/217* (2006.01)
*H03F 3/24* (2006.01)
*H03F 1/34* (2006.01)

(52) U.S. Cl.
CPC ........... *H03F 3/2173* (2013.01); *H03F 1/342* (2013.01); *H03F 3/245* (2013.01); *H03F 2200/03* (2013.01); *H03F 2200/153* (2013.01); *H03F 2200/351* (2013.01)

(58) Field of Classification Search
CPC ........ H03F 3/2173; H03F 1/342; H03F 3/245; H03F 2200/03; H03F 2200/351; H03F 2200/153; H03F 3/217; H03F 3/2171
USPC ..................................... 330/207 A, 251, 291
See application file for complete search history.

(56) References Cited

U.S. PATENT DOCUMENTS 3,898,532 A 8/1975 Frank
5,200,708 A 4/1993 Morris, Jr.
(Continued)

FOREIGN PATENT DOCUMENTS

CN 101021451 8/2007
CN 101590863 12/2009
(Continued)

*Primary Examiner* — Khanh V Nguyen (57) ABSTRACT

A circuit for stabilizing a Class-D audio amplifier having a loop bandwidth modulator configured to modulate a loop bandwidth of the amplifier as a function of one or more control signals, a tuned output filter terminator coupled to a low-pass filter and configured to provide stabilizing control feedback to loop bandwidth modulator, and a carrier injection system configured to provide a wide range fixed frequency operation. Also, a method of stabilizing a feedback network within a Class-D amplifier by providing a first feedback loop coupling an output of a PWM logic stage of the amplifier to an input circuit of the amplifier, providing a second feedback loop coupling an output of a switching output stage of the amplifier to the input circuit, and providing a third feedback loop coupling an output of a low-pass filter of the amplifier to the input circuit.

13 Claims, 9 Drawing Sheets

Related U.S. Application Data

62/429,662, filed on Dec. 2, 2016, provisional application No. 62/450,543, filed on Jan. 25, 2017.

(56) References Cited

U.S. PATENT DOCUMENTS

| | | | |
|---|---|---|---|
| 5,909,153 A * | 6/1999 | Delano | H03C 1/06 |
| | | | 330/10 |
| 5,940,518 A | 8/1999 | Augustyn | |
| 6,778,011 B2 * | 8/2004 | Noro | H03F 3/2171 |
| | | | 330/10 |
| 7,002,406 B2 * | 2/2006 | Risbo | H03F 3/217 |
| | | | 330/10 |
| 8,416,017 B2 | 4/2013 | Kohut | |
| 8,508,300 B2 | 8/2013 | Lee | |
| 8,559,655 B2 | 10/2013 | Mihelich | |
| 9,100,760 B2 | 8/2015 | Tackett | |
| 9,179,236 B2 | 11/2015 | Robinson et al. | |
| 9,191,737 B2 | 11/2015 | Subat | |
| 2003/0138115 A1 | 7/2003 | Krochmal | |
| 2004/0176955 A1 | 9/2004 | Farinelli | |
| 2004/0184619 A1 | 9/2004 | Inagaki | |
| 2004/0260416 A1 | 12/2004 | Kellom | |
| 2005/0017695 A1 | 1/2005 | Stanley | |
| 2005/0162223 A1 | 7/2005 | Maejima | |
| 2006/0082414 A1 | 4/2006 | Xu | |
| 2006/0233055 A1 | 10/2006 | Hendrickson | |
| 2007/0069930 A1 | 3/2007 | Butler | |
| 2007/0247219 A1 | 10/2007 | Jesus Rodriguez | |
| 2008/0231463 A1 | 9/2008 | Feight | |
| 2009/0167228 A1 | 7/2009 | Chung | |
| 2009/0220110 A1 | 9/2009 | Bazarjani | |
| 2009/0315623 A1 | 12/2009 | Dooper | |
| 2010/0123876 A1 | 5/2010 | Furihata | |
| 2010/0239102 A1 | 9/2010 | Miao | |
| 2010/0277238 A1 * | 11/2010 | Nielsen | H03F 3/217 |
| | | | 330/251 |
| 2011/0091052 A1 | 4/2011 | Wang | |
| 2012/0121105 A1 | 5/2012 | Holladay | |
| 2013/0329912 A1 | 12/2013 | Krishnaswamy | |
| 2014/0140540 A1 | 5/2014 | Staal | |
| 2014/0214431 A1 | 7/2014 | Vinton | |
| 2014/0247892 A1 | 9/2014 | Williams | |
| 2014/0265630 A1 | 9/2014 | Zhou | |
| 2015/0223002 A1 | 8/2015 | Mehta | |
| 2015/0271620 A1 | 9/2015 | Lando | |
| 2015/0327815 A1 | 11/2015 | Hwang | |
| 2015/0350804 A1 | 12/2015 | Crockett | |
| 2016/0192101 A1 | 6/2016 | Park | |

FOREIGN PATENT DOCUMENTS

| | | |
|---|---|---|
| CN | 202565384 | 11/2012 |
| CN | 203603982 | 5/2014 |
| CN | 104977874 | 10/2015 |
| EP | 0250488 | 1/1988 |
| EP | 2387149 | 11/2011 |
| EP | 2562931 | 2/2013 |
| EP | 2849341 | 3/2015 |
| JP | S59-176913 | 10/1984 |
| WO | 01/26222 | 4/2001 |
| WO | 01/071905 | 9/2001 |
| WO | 2007/087586 | 8/2007 |
| WO | 2008/037261 | 4/2008 |
| WO | 2009/010056 | 1/2009 |
| WO | 2009/070004 | 6/2009 |
| WO | 2010/075776 | 7/2010 |
| WO | 2015/105788 | 7/2015 |

* cited by examiner

CLASS-D DYNAMIC CLOSED LOOP FEEDBACK AMPLIFIER

CROSS-REFERENCE TO RELATED APPLICATIONS

The present application is a Continuation-In-Part application of International Application No. PCT/US2017/015476, entitled "Multi-Channel Amplifier with Continuous Class-D Modulator and Embedded PLD and Resonant Frequency Detector," and filed on 27 Jan. 2017, which in turn claims priority to European Patent Application No. 16153471.4 filed 29 Jan. 2016; U.S. Patent Application No. 62/289,037 filed 29 Jan. 2016; U.S. Patent Application No. 62/429,682 filed 2 Dec. 2016; U.S. Patent Application No. 62/429,662 filed 2 Dec. 2016; and US. Patent Application No. 62/450,543 filed 25 Jan. 2017, which are hereby incorporated by reference in its entirety.

FIELD OF THE INVENTION

One or more implementations relate generally to audio power amplifiers, and more specifically to a Class-D amplifier circuit with dynamic closed-loop feedback.

BACKGROUND

Class-D amplifiers amplify an audio signal for driving a loudspeaker or other dynamic load using efficient switch-mode power conversion techniques. Such switching amplifier topologies typically have a transistorized output stage capable of generating a high voltage, high speed square wave that is passed through a low-pass filter to reduce the high frequency component and effectively provide an analog reconstruction filtration process. The low pass filter is typically terminated by the load attached to the amplifier, which broadly comprises various loudspeakers and/or similar transducers. These loads are traditionally designed to present a nominal impedance to the output filter, typically in the range of 2 to 16 ohms.

As with any amplifier, negative feedback is used to correct errors induced through the various stages of signal modulation, amplification, filtering, and reconstruction. Unfortunately, closing the feedback loop around all the stages within a Class-D switching amplifier and maintaining stability over a broad range of load and drive conditions can be difficult. This is especially true given the phase shift aspects of the passive output filter (LC low pass) when operating with various real-world loading scenarios.

The task of closing the feedback loop is further complicated by the fact that many Class-D amplifier modulation schemes have non-fixed switching frequencies. In other words, the switching frequency changes with the modulation index, as the amplifier output signal swings toward a higher drive amplitude, the switching frequency decreases, and as the amplifier output signal moves toward the zero crossing or lower amplitude, the switching frequency increases. This dynamic modulation of the switching frequency complicates the task of ensuring stability over all load scenarios.

Previous amplifier designs have focused on traditional loop stability solutions in which appropriate pole zero placement within a combination of proportional, integral, and differential stages results in marginal phase margin over a limited range of operability and modulation index. Unfortunately, there are cases where instability can occur due to non-linear load dynamics, light load or open load conditions, high slew rate stimulus, and excessive switching frequency modulation. When this instability is exposed, these amplifiers can suffer from sustained high frequency oscillation, excessive power draw, increased thermal dissipation, very poor high-modulation or clipping performance, and can ultimately result in output stage component failure.

It should also be noted that previous feedback compensation and loop filtration schemes have utilized fixed pole-zero placement in which the transfer function of the compensation elements and the loop filter has been fixed. In this case, the pole-zero positioning within the compensation network and the loop filter have a fixed transfer function and have been tuned for the worst-case phase shifts caused by various elements within the loop, including the dynamic phase shift associated with the passive output filter. Some designs have utilized one global feedback loop, whereas others have attempted two feedback loops, but in all cases the pole-zero placement in the compensation and loop filter stages are fixed and have a fixed transfer function. Thus, the loop transfer function cannot be adjusted or modulated in real-time and can only be configured for one operational condition, which is typically the worst-case phase shift scenario resulting from an unterminated output filter. Unfortunately, these previous designs do not allow for improved feedback operation under different operational conditions and loads, and therefore, the audio performance is less than ideal.

Additional problems have also arisen in multi-channel Class-D audio amplifier designs with non-fixed switching frequencies. The changing asynchronous switching frequencies of closely spaced Class-D modulators has resulted in issues such as beat notes, increased noise floor, and excessive channel-to-channel cross-talk or inter-channel interference. While the root cause has been understood to be the dynamic and non-fixed nature of the Class-D modulator frequencies, fixing the switching frequencies of the closely spaced modulators can be a difficult task, especially over a wide portion of the modulation index range.

Previous attempts to fix the switching frequency of Class-D modulators have generally suffered from limited range or increased complexity and cost. For example, some designs have opted for hysteretic window modulation to attempt fixed frequency operation. Unfortunately, this technique typically does not work over the entire modulation index desired from the amplifier and is limited solely to hysteretic implementations. Other prior art approaches have focused on carrier injection techniques, which offers simplified implementation, but again only provide a limited range of fixed frequency operation, wherein the switching frequency only remains fixed below a certain modulation index. In other words, as the amplifier output swings to higher levels there is an amplitude above which the switching frequency will no longer remain constant. As the amplitude is increased further, the Class-D modulator switching frequency will move further away from the intended fixed frequency operation. This deviation in switching frequency below the intended operating frequency will result in greatly increased output ripple, reduced open loop bandwidth and loop gain, and can lead to increased distortion within the output waveform.

Alternatively, other schemes have attempted to fix the switching frequency through complex frequency locking loops that effectively modulate the loop gain of the Class-D control loop. These approaches do offer a wider range of fixed frequency operation, but the frequency locked loop topologies have a high degree of complexity, require voltage-controlled gain stages and PID control structures, and a higher cost associated with implementation.

Another element of Class-D amplifiers that presents various problems to a designer is the passive output filter. The output low pass filters on Class-D amplifiers are typically constructed with passive LC components which are optimized for termination into nominal loudspeaker load impedances. Unfortunately, the impedance of real-world loudspeakers is rarely a fixed impedance and in many cases the loudspeaker load can be disconnected entirely, leaving the output LC filter without an audio-band termination impedance. Previous designs have attempted to minimize these problems through Zobel RC terminations that offer some termination impedance at high frequencies. Unfortunately, these terminations are lossy, generate excessive heat, add to system cost, and many times do not terminate the filter adequately during open-load scenarios.

Additionally, if a designer wishes to encompass the output filter within one or more feedback loops, the wide range of terminating impedances and the resulting varied phase shifts wreak havoc on maintaining loop stability. For example, a passive LC output filter when terminated by the designed termination impedance will exhibit a nominal phase shift of 90 degrees, which can be accounted for within the closed loop, post-filter feedback compensation. However, when the same passive LC filter is terminated with non-ideal load impedances or open load conditions, the nominal phase shift will increase to 180 degrees and exhibit very sharp asymptotic change at the natural resonant frequency of the LC output filter. With this poor termination scenario, the closed loop feedback compensation has difficulty maintain adequate phase margin and can lead to undampened oscillation. Also, if the loop compensation elements are adjusted to try maintaining stability during open load scenarios, the loop performance is not ideally tuned for situations wherein the output filter is properly terminated, such as when a loudspeaker termination is present, thus the amplifier's distortion will be elevated due to poorly optimized loop gain. In other words, designs that attempt to include the output filter within a control feedback network face great challenges due to the dynamic and changing phase characteristics of the output LC filter. Optimizing for stability during open load situations, leads to poor distortion performance under normal load situations, conversely, optimizing for distortion performance under normal load scenarios leads to poor phase margin, instability, and potential for oscillation under open load conditions.

As a result of the aforementioned problems with the state of the art in Class-D audio amplifiers, what is needed is a Class-D amplifier design that provides a fixed frequency architecture with a feedback control methodology that is stable over all load and drive scenarios.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF EMBODIMENTS

Embodiments are directed to an audio amplifier having a circuit implementing a method for stabilizing a feedback network within Class-D audio amplifiers and providing fixed frequency operation of the Class-D modulator, wherein one or more feedback loops can encompass the output low pass filter, loop stability can be well maintained over all loading scenarios, and fixed-frequency clocked oscillation can be achieved.

Embodiments are directed to a circuit for stabilizing a Class-D audio amplifier having a loop bandwidth modulator configured to modulate a loop bandwidth of the amplifier as a function of one or more control signals; a tuned output filter terminator coupled to a low-pass filter of the amplifier and configured to provide stabilizing control feedback to loop bandwidth modulator; and a carrier injection system functionally coupled to the loop bandwidth modulator and configured to provide a wide range fixed frequency operation. The loop bandwidth modulator dynamically controls a transfer function of the amplifier loop including phase and frequency response with respect to the one or more control signals by dynamically moving the poles of a main feedback loop filter through real-time continuous control modulation. The loop bandwidth modulator is controlled by at least one of an amplitude of an input audio signal or an amplitude of an output audio signal, such that as the amplitude increases, the loop bandwidth decreases; and as the amplitude decreases, the loop bandwidth increases.

In an embodiment, the loop bandwidth modulator effectively provides dynamic phase adjustment during high modulation index conditions, which in-turn increases the synchronization range of the carrier injection system. The carrier injection system interfaces with the modulator just after the loop bandwidth adjustment stage but prior to the quantization stage. The tuned output filter termination circuit is configured to feedback to the loop bandwidth modulator to mitigate resonant output filter ringing and undamped oscillation. In an embodiment, the tuned output filter termination circuit comprises a tuned resistor-inductor-capacitor (RLC) circuit tuned to a resonant frequency of the low-pass filter of the amplifier, and a detection circuit configured to provide feedback to a prior stage of the loop bandwidth modulator to provide a means to adjust a modulation index to maintain a minimum amount of stability. The circuit may further comprise a set of nested feedback loops coupling an input stage of the amplifier to each of an output of a modulator logic stage, a switching output stage, and a low-pass filter stage.

Embodiments are further directed to a Class-D amplifier comprising an input circuit receiving an audio signal; a pulse-width modulator (PWM) logic stage coupled to the input circuit; a switching output stage coupled to the PWM logic stage; a passive low-pass filter coupled to the switching output stage; a first feedback loop coupling an output of the PWM logic stage to the input circuit; a second feedback loop coupling an output of the switching output stage to the input circuit; and a third feedback loop coupling an output of the low-pass filter to the input circuit. The amplifier may further comprise a carrier injection circuit injecting a clock signal into the PWM logic stage. It may also further comprise a tuned output termination circuit coupled to the low-pass filter. It may yet further comprise a loop bandwidth modulator providing dynamic control of the overall loop bandwidth by providing a voltage controlled filtration stage that allows filter poles to increase or decrease in frequency, and thereby dynamically adjust the phase shift seen throughout the overall control loop.

Embodiments are further directed to a method of stabilizing a feedback network within a Class-D amplifier, by providing a first feedback loop coupling an output of a PWM logic stage of the amplifier to an input circuit of the amplifier; providing a second feedback loop coupling an output of a switching output stage of the amplifier to the input circuit; and providing a third feedback loop coupling an output of a low-pass filter of the amplifier to the input circuit. The method may further comprise providing a carrier injection circuit injecting a clock signal into the PWM logic stage; and providing a tuned output termination circuit coupled to the low-pass filter. The method may yet further comprise providing a loop bandwidth modulator providing dynamic control of the overall loop bandwidth by providing a voltage controlled filtration stage that allows filter poles to increase or decrease in frequency, and thereby dynamically adjust the phase shift seen throughout the overall control loop.

Embodiments are yet further directed to methods of making and using or deploying the circuits, amplifier stages and components described herein.

INCORPORATION BY REFERENCE

Each publication, patent, and/or patent application mentioned in this specification is herein incorporated by reference in its entirety to the same extent as if each individual publication and/or patent application was specifically and individually indicated to be incorporated by reference.

BRIEF DESCRIPTION OF THE DRAWINGS

In the following drawings like reference numbers are used to refer to like elements. Although the following figures depict various examples, the one or more implementations are not limited to the examples depicted in the figures.

DETAILED DESCRIPTION

Systems and methods are described for method for stabilizing a feedback network within Class-D audio amplifiers and providing fixed frequency operation of the Class-D modulator, wherein one or more feedback loops can encompass the output low pass filter, loop stability can be well maintained over all loading scenarios, and fixed-frequency clocked oscillation can be achieved.

Any of the described embodiments may be used alone or together with one another in any combination. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

Many audio amplifiers employ Class-D amplifier circuits, which generally offer significant power-efficiency advantages over linear audio-amplifier classes such as Class A, B, and AB. Basic Class-D amplifiers use pulse-width modulation (PWM) with a triangle-wave (or sawtooth) oscillator. In a general design, the circuit comprises a PWM, two output transistors (e.g., MOSFETs) and an external low-pass filter to recover the amplified audio signal. The output transistors switch the output to either $V_{DD}$ or ground to produce a high-frequency square wave, which is pulse-width modulated by the input audio signal. Modulation is accomplished by comparing the input audio signal to an internally generated triangle-wave (or sawtooth) oscillator, which acts as the sampling clock. The resulting duty cycle of the square wave is proportional to the level of the input signal, and when no input signal is present, the duty cycle of the output waveform is equal to 50%.

Figure 1:
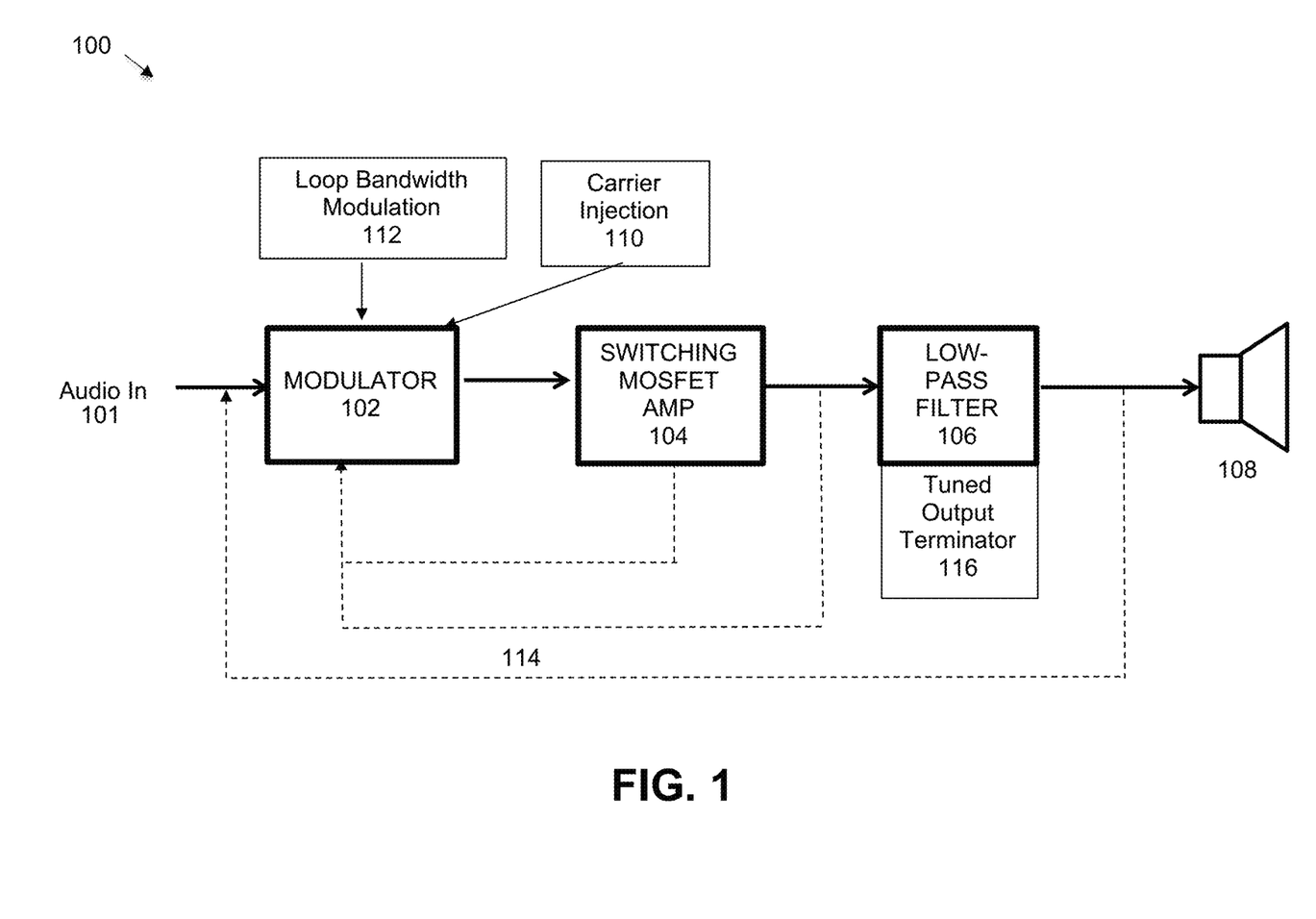
FIG. 1 illustrates a basic block diagram of a Class-D amplifier with additional components that improve stability and frequency control issues, under some embodiments.

Embodiments described herein provide solutions to certain stability problems and switching frequency control issues within Class-D audio amplifiers. FIG. 1 illustrates a basic block diagram of a Class-D amplifier with additional components that improve stability and frequency control issues, under some embodiments. As shown in FIG. 1, amplifier 100 comprises the main functional blocks of a modulator 102 that receives an audio input signal 101 and derives a Pulse Width Modulated (PWM) signal for passage to the switching MOSFET output stage 104. The amplified PWM signal is then passed through a low-pass output filter 106 that reconstructs the analog audio signal from the PWM signal for output to speaker or speakers 108. In an embodiment, the Class-D amplifier 100 is modified and enhanced through the use of a novel loop bandwidth modulation scheme 112, a tuned output filter termination topology 116 that uniquely provides stabilizing control feedback, a carrier injection system 110 that works in conjunction with the modulator 102 to ensure wide range fixed frequency operation, and multiple nested feedback loops 104 to provide dynamic real-time adjustment of the loop transfer function.

With respect to the modulator 102, class D modulation techniques encode information about the input audio signal into a stream of pulses. Generally, the pulse widths (and in some cases the pulse density also) correspond to the amplitude of the audio signal, and the spectrum of the pulses includes the desired audio signal plus undesired high-frequency content. Modulator 102 employs a sigma-delta modulation approach for deriving a singular stream of pulses at a synchronized carrier frequency. The sigma-delta modulation consists of a summation stage operable to (1) sum the feedback paths with the inbound audio path, (2) integrate the summed signal, (3) inject a periodic synchronization signal, and (4) digitally quantize the continuous-time analog signal to derive the desired pulse modulated signal stream. Within each period of the carrier, the duty ratio of the PWM pulse is proportional to the amplitude of the audio signal. In general, PWM modulators are stable up to nearly 100% modulation, however, the PWM process inherently adds distortion in many implementations and PWM pulse widths become very small near full modulation. This causes problems in most switching output-stage gate-driver circuits with their limited drive capability, as they cannot switch properly at the excessive speeds needed to reproduce short pulses with widths of a few nanoseconds.

Loop Bandwidth Modulator

In an embodiment, amplifier 100 has a loop bandwidth modulation component 112 that provides a means to modulate the loop bandwidth as a function of one or more controlling signals. This technique provides several key advantages in the art of Class-D amplifier modulation and control, such as improved loop stability, increased fixed frequency operational range when used in conjunction with proper carrier injection 110, and reduced signal distortion.

Modulating the loop bandwidth within the Class-D control loop allows dynamic control of the transfer function of the loop, including the phase and frequency response, with respect to one or more modulating control signals. Increasing the loop bandwidth by adjusting the transfer function via moving the loop filter poles out in frequency, can be beneficial during low amplitude zero-crossing scenarios, but can present stability problems at high modulation indexes and amplitudes. Whereas decreasing the loop bandwidth can be beneficial during high amplitude and high modulation indexes, embodiments thereby improve the overall loop phase margin. As a result, amplifier 100 gains the advantages of minimizing low index cross-over distortion, while maintaining stability over the full range of usable modulation index. In addition to providing stability and lower distortion components, modulating the loop bandwidth greatly improves the range of modulator synchronization when employing carrier injection synchronization techniques.

Figure 2:
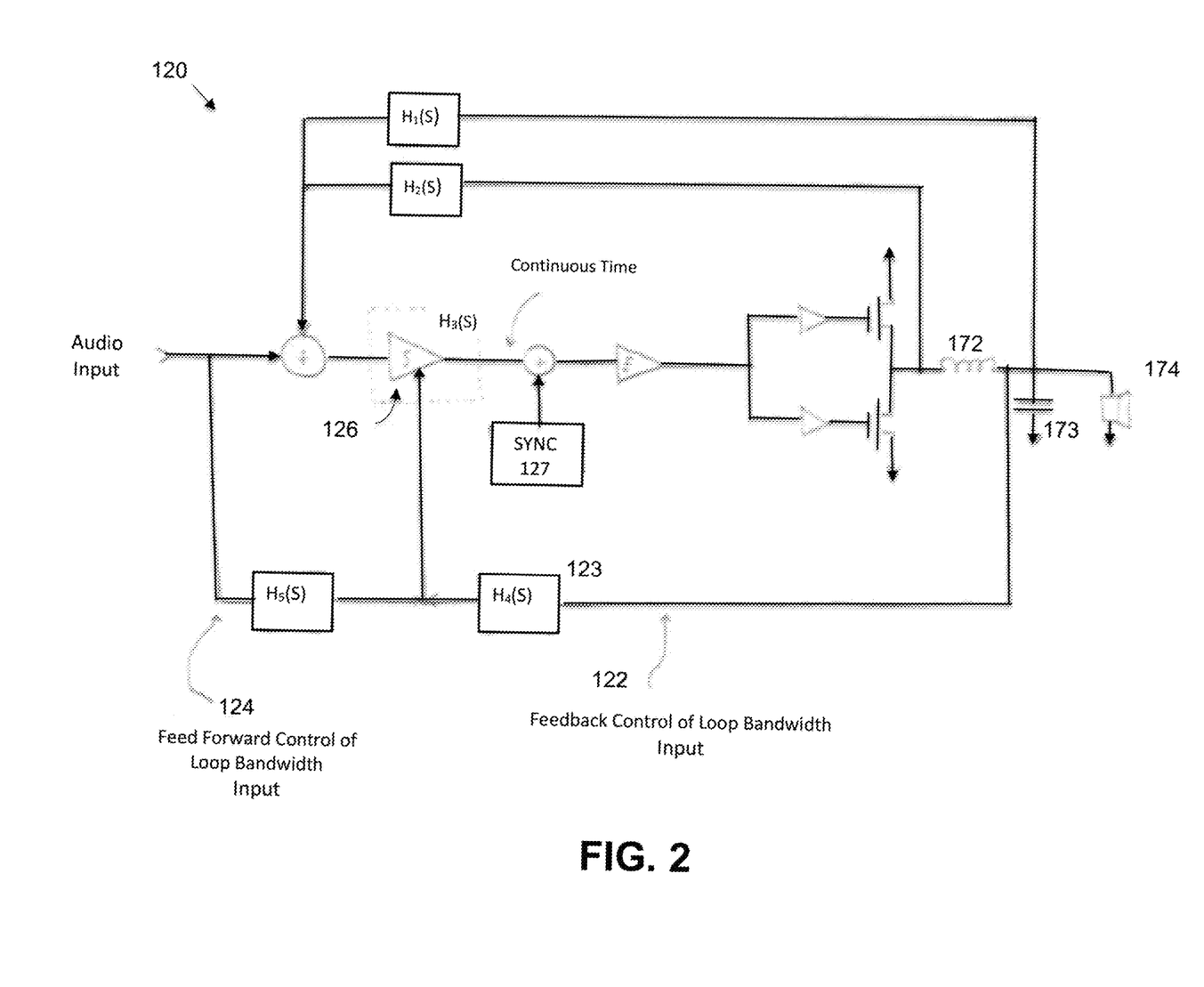
FIG. 2 is a block diagram of a Class-D modulator stage with a loop bandwidth modulation circuit, under some embodiments.

FIG. 2 is a block diagram of a Class-D modulator stage with a loop bandwidth modulation circuit, under some embodiments. Diagram 120 illustrates the circuit of FIG. 2 with a feedback control of loop bandwidth circuit 122 and a feed forward control of loop bandwidth circuit 124. The feedback control loop 122 includes a component 123 that imparts a transfer function $H_4(s)$ on the output of the amplifier and inputs this to integrator circuit 126. In an embodiment, transfer function $H_4(s)$ may be a signal processing function that functions as a rectifier, absolute value function (ABS) or DC bias as needed, and the like. In a practical embodiment, $H_4(s)$ comprises active rectification with some frequency shaping. Additional elements in this loop may attenuate the signal. As shown in FIG. 2, an embodiment may also benefit from controlling the loop bandwidth via a feed-forward approach, wherein the input audio signal is used to modulate the loop bandwidth. In this manner, the system may use a combination or ratio of feedback and feed-forward control. It should be clear to one skilled in the art that such an approach could rely solely on feedback or feed-forward control of the loop bandwidth.

Figure 3:
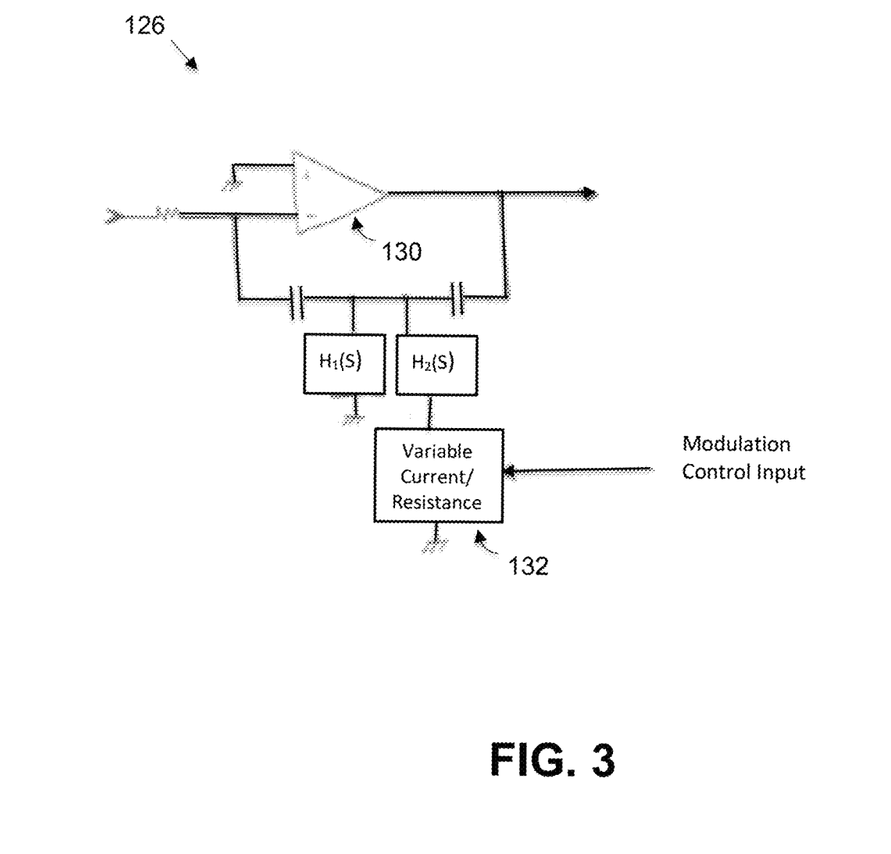
FIG. 3 is a detailed diagram of the integrator circuit of FIG. 2, under some embodiments.

FIG. 3 is a detailed diagram of the integrator circuit 126 of FIG. 2, under an embodiment. Integrator 126 comprises an op-amp circuit 130 that is configured as a second-order integrator. The integrator 126 of FIG. 3 also includes a mechanism to effectively change the frequency and phase response of the integrator via a dynamic resistance or current sink, 132. Control for this integrator can be a feedback or feed-forward signal (as described above) to modulate the loop bandwidth by dynamically changing the characteristics of the integrator. As shown in FIG. 3, the modulation control input, which is shaped by transfer function $H_4(s)$ and could be an attenuated and rectified (ABS) version of the amplifier output signal, is input to a variable current/resistance circuit 132. In an embodiment, this may be implemented as a JFET device, variable resistor, current mirror, transconductance amplifier, or similar circuit. This causes the integrator to no longer have a fixed transfer characteristic, but instead allows the frequency and phase response to move with respect to the modulating signal. The ability to modulate the loop bandwidth by changing the characteristics of the integrator provides a degree of phase boost that increases the effective lock range to synchronization signal 127 (SYNC) during high modulation events. It also helps keep THD low even at high gain levels by keeping the loop bandwidth wider than it would be without modulation. This system also improves the zero-crossing distortion (ZCD) that occurs with present Class-D amplifiers. This design, in which the loop is modulated based on the input or output audio helps the amplifier maintain synchronization with the external injected carrier and aids in reducing THD across all gain levels. It does this by changing the frequency and phase response of the control loop, as opposed to changing loop gain as may be done in some current amplifier systems.

FIG. 2 illustrates certain components that impart transfer functions $H_x(s)$ on the intermediate and output signals of the amplifier. Under some embodiments, the control signals used for modulating the loop bandwidth and the circuit topologies incorporated to substantiate the actual loop bandwidth modulator can vary greatly. In general, the control signals can be based upon amplitude or frequency characteristics and can be derived from voltage or current waveforms within the Class-D modulator, the input stage, or the output of the amplifier. Common implementations have utilized both feed-forward and feed-back signals to control the loop bandwidth modulator (as shown in FIG. 2), with some embodiments using voltage amplitude modulation to directly control the loop bandwidth modulator. In other words, the amplitude of the audio signal, input or output, may be used to control the bandwidth modulation stage. As the audio amplitude increases, loop bandwidth can be appropriately decreased, and conversely, when the audio amplitude is falling, the loop bandwidth can be increased.

In certain embodiments, bandwidth modulator 112 modulates the loop bandwidth through modulator 102 by dynamically moving the poles of the main feedback loop filter via real-time continuous control modulation. This technique ultimately impacts the main feedback compensation network by moving the poles associated with the loop filter. In this manner, the modulator does not rely upon fixed pole-zero compensation networks found in present and previous Class-D implementations, and therefore achieves a notable advantage in stability when compared to fixed compensation approaches. The rate of change or time constants associated with the loop bandwidth control signals and the loop bandwidth modulator can be greatly varied to fine-tune the amplifier to ensure wideband stability, reduced distortion, and wide range fixed frequency synchronization.

Figure 4:
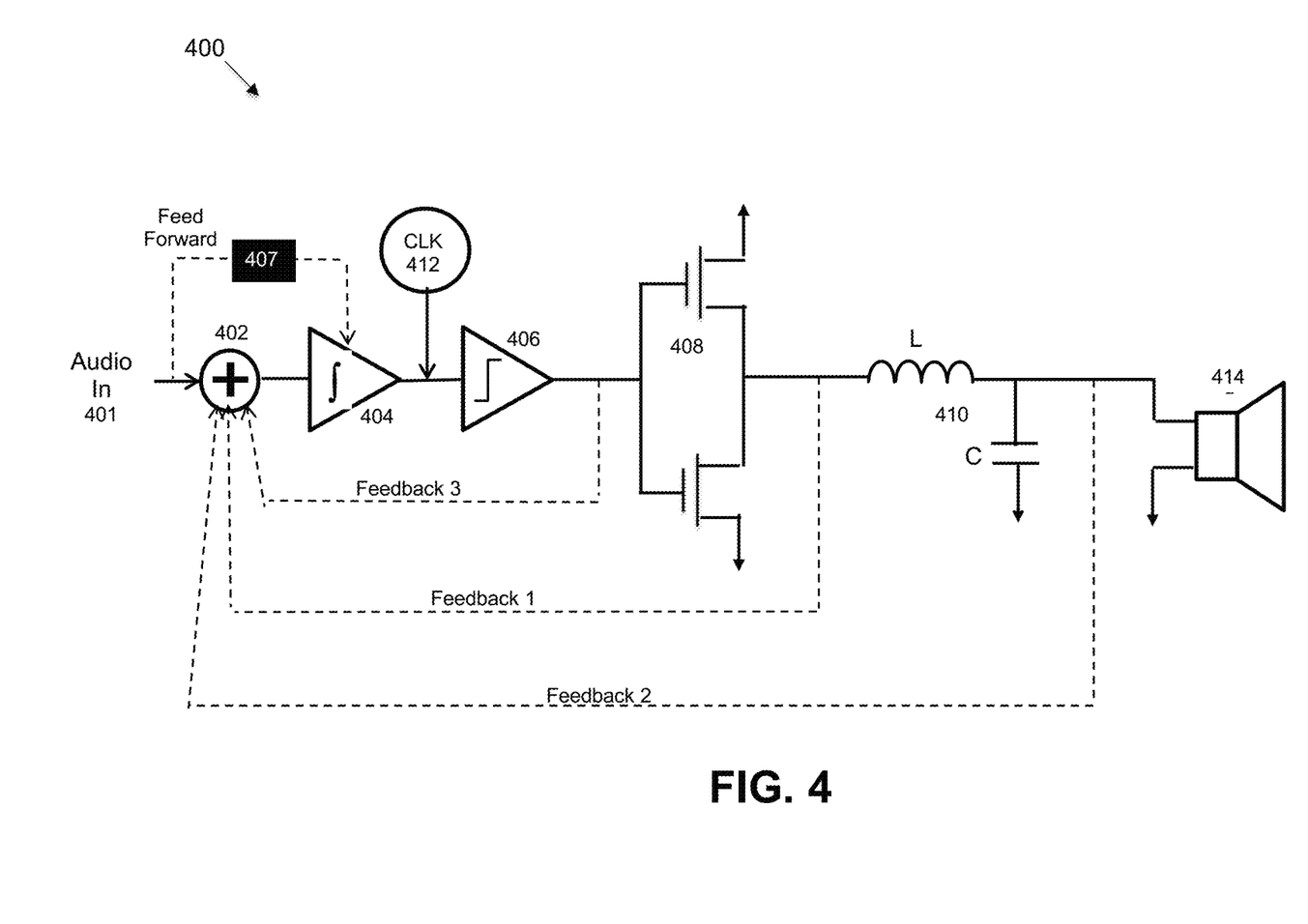
FIG. 4 illustrates a Class-D amplifier having nested feedback loops for dynamic loop bandwidth control, under some embodiments.

In an embodiment, the Class-D amplifier 100 provides a unique combination of multiple feedback loops 114, a nested loop control, and a dynamic loop bandwidth modulator, to provide maximum stability and minimized distortion. FIG. 4 illustrates a Class-D amplifier having nested feedback loops for dynamic loop bandwidth control, under some embodiments. Amplifier 400 comprises the basic components of a modulator stage 404/406 receiving the audio input 401 and MOSFET-based switching output stage 408 which feeds the amplified PWM signal to speaker 414 through the LC low-pass filter 410. The embodiment of FIG. 4 illustrates the use of three predominant feedback loops, and a feed forward loop with a bandwidth modulator 407, and an additional output filter termination control loop. In this embodiment, one feedback loop (Feedback 3) is derived from the output of the PWM logic stage, a second feedback loop is derived from the high voltage switching output stage (Feedback 1), a third feedback loop is derived from the output of the passive LC output filter (Feedback 2), and the loop bandwidth modulator is operable to provide dynamic compensation of the said feedback loops by moving the poles of a second-order loop filter via a feed-forward input control stage. The feed forward path comprises a variable control path that allows the integrator 404 to permit loop bandwidth modulation. For the embodiment of FIG. 4, the three feedback loops are combined in a summing circuit 402 in the input stage of amplifier 400.

Employing the nested loop configuration shown in FIG. 4 allows error correction of three critical stages, namely the PWM modulation and digital logic stage, the output switching MOSFET stage, and the output low pass filter stage. All of these stages within the amplifier can add errors to the ideal modulated signal, and thus employing error correction feedback on each of these stages improves the overall distortion of the amplifier. By placing the loop bandwidth modulated integrator after the summation stage and within the singular forward path, all three loops gain the benefits of loop bandwidth modulation that has been previously discussed.

In an embodiment, a tuned output filter termination circuit 116 (as shown in FIG. 1) is operable to provide yet another feedback mechanism to the PWM control logic, thus ensuring proper termination and dynamic load stability. Operation of the tuned output filter termination circuit is described in greater detail below.

Carrier Injection

In conjunction with the loop bandwidth modulation scheme 112, amplifier 100 uses a carrier injection topology 110 to provide fixed-frequency operation that ensures wide-range fixed frequency operation that can be synchronized to an outside clock source. Modulating the loop bandwidth has the advantage of ensuring high phase boost during moments of high modulation index. Previous carrier injection schemes have generally failed to maintain synchronicity and fixed-frequency operation as the modulation index increased. However, for the circuit of FIG. 1, the loop phase boost is increased during high modulation index conditions, thereby maintaining synchronicity over a broad modulation index range.

Figure 5:
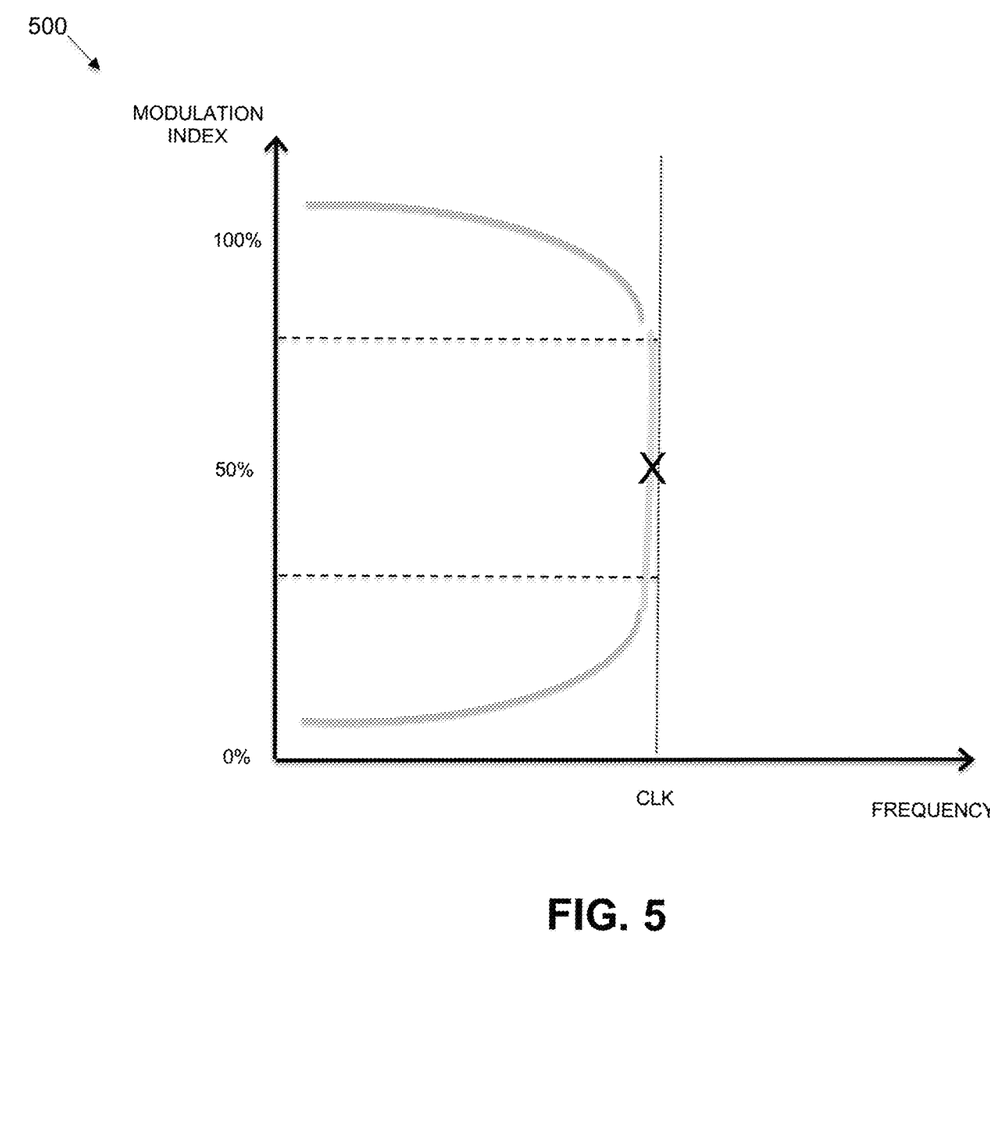
FIG. 5 illustrates a plot of the modulation index versus the clock signal for a carrier injection topology, under some embodiments.

For the embodiment of FIG. 4, the carrier injection topology is implemented by injecting a clock (CLK) signal into the path between integrator 404 and modulator 406. FIG. 5 illustrates a plot of the modulation index versus the clock signal for a carrier injection topology, under some embodiments. Carrier injection is typically implemented by injecting a clock, or other periodic waveform, into the forward path of the modulator, specifically injecting the signal after the integrator but prior to the quantization comparator. Ensuring the modulator remains "locked" to the injected synchronizing signal is critical for multi-channel amplifier designs, and helps ensure stability of the design. As the modulation index changes from low modulation conditions to high modulation conditions, previous Class-D designs have suffered from limited lock ranges. In other words, they would lose lock or break away from the desired carrier clock frequency. The diagram of FIG. 5 presents a graphical representation of this phenomenon, wherein the amplifier's switching frequency is plotted on the x-axis and the modulation index is plotted on the y-axis. The lock-range is indicated as region X as shown within the dashed lines, i.e., approximately 30% to 70% modulation index. As can be seen in this diagram, the amplifier remains locked to the clock frequency (CLK) throughout region X, but breaks away and loses lock when the modulation index exceeds the lock range. Ideally, the lock range would encompass a broad range of the modulation index, but previous designs have suffered from limited lock range. The present invention greatly increases the lock range by employing loop bandwidth modulation techniques that have been previously discussed. By ensuring high phase margin, the invention allows the modulator to remain locked to the injected carrier for a broader range than previous Class-D implementations.

Termination/Detector Circuit

Embodiments also include a unique tuned output filter termination circuit 116 that is operable to provide feedback to one or more control circuits, such as the loop bandwidth modulator or PWM modulation index control logic. Using this tuned termination and feedback architecture allows the present invention to achieve stability over all load and drive scenarios, and can mitigate resonant LC output filter ringing and undamped oscillation. By placing a tuned RLC circuit and appropriate detection and feedback circuits at the output of the passive LC output filter, the invention is able to adequately terminate the LC output filter under all load scenarios, while minimizing loss, and providing a mechanism to dampen unwanted ringing. While not limited thereto, the embodiments typically utilize an RLC circuit tuned to the resonant frequency of the output LC filter, with a subsequent detection circuit to provide feedback to a prior stage within the modulator wherein the loop bandwidth or PWM modulation index can be adjusted to maintain stability. Thus, incorporating the tuned termination and feedback circuit in conjunction with the loop bandwidth modulator provides a unique mechanism for ensuring the stability of the control loop that encompasses the passive output filter. The subsequent detection circuit referenced above is described in greater detail below The loop bandwidth circuit of FIG. 3 includes an inductor/capacitor (LC) circuit comprising an inductor 172 and a capacitor 173 coupled to ground and to a speaker 174. When the speaker 174 is present on the output of the circuit a normal load is present. When no loudspeaker is connected, however, the circuit is unterminated and has an open load. In an open load condition, the natural resonance of the LC circuit results in a large phase shift at resonance, which can cause certain instability issues within the feedback control loop. These instabilities can lead to unwanted high-frequency oscillations, and other similar effects.

Open load conditions can be caused by blown or malfunctioning speakers as well simply leaving the speaker terminals unattached to speakers. Depending on deployment and configuration scenarios, certain conditions such as a high frequency stimulus, such as may be caused by a hard-clipping condition on a channel or driving the amp with a square wave may cause a situation in which the power supply running all channels is unable to hold the power rails sufficiently high enough when the channel output demands are high. In this case, the one or more open-load channels can fully clip causing high-frequency oscillation. Such an oscillation condition, if left undamped could lead to cross-channel distortion (e.g., audio artifacts), wasted power, overheating conditions, and so on. In an embodiment, the LC output stage features a built-in termination circuit that loads the LC circuit by creating a low-impedance load to keep the LC circuit from oscillating when there is no speaker or external load attached. In an example embodiment, this termination scheme provides robustness to the loop bandwidth modulation circuit and to the output stages of the high-channel count amplifier, in general. Such a circuit may also provide a high-frequency detection function that can be used to detect an open load condition and/or the onset or presence of high-frequency oscillations on the output stage of the amplifier.

Figure 6:
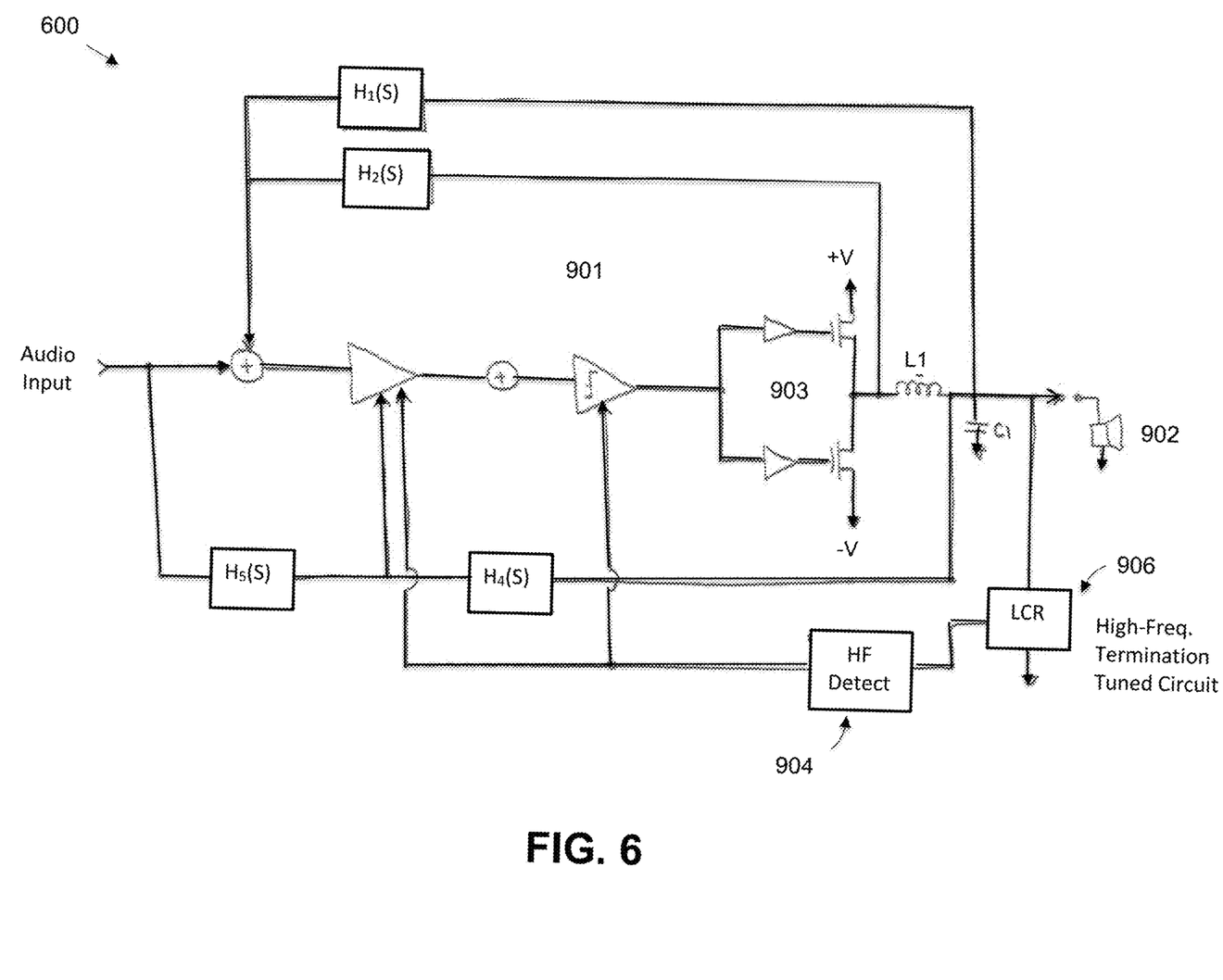
FIG. 6 is a block diagram of the Class-D modulator stage of FIG. 2 with a loop bandwidth modulation circuit and high frequency detection and termination tuned circuit, under some embodiments.

FIG. 6 is a block diagram of the Class-D modulator stage of FIG. 2 with a loop bandwidth modulation circuit and high frequency detection and termination tuned circuit, under some embodiments. As shown in diagram 600, the overall modulator stage 901 has an LC output stage comprising inductor L1 and capacitor C1, which together comprise an output filter that is connected to the output of a bridge circuit 903, which may be implemented as a transistor (e.g., MOSFET) bridge circuit. In an audio amplifier application, the output of this filter ends in a speaker connection port for detachable coupling of a speaker 902. When such a speaker is attached, the amplifier output stage has sufficient load to prevent any LC resonance issues. If no speaker is attached, however, an open load condition exists. To fix this issue, a high frequency LCR (inductor-capacitor-resistor) circuit 906 is provided to damp the natural LC resonance and prevent or minimize any high-frequency oscillation effects. In an embodiment, circuit 906 is a tuned LCR circuit that is configured to provide a level of impedance termination at the natural resonant frequency of the primary L1/C1 output filter. This circuit thus provides damping of this resonance. The resonant frequency of the primary output filter is defined by the equation:

$$f_0 = \omega_0/2\pi = 1/(2\pi SQRT(LC))$$

The natural resonance of an undamped LC circuit results in a drop or minimization of the amplifier output impedance and a significant phase shift at the resonant frequency. The tuned termination circuit 906 provides a low-impedance load to properly terminate and dampen the LC output filter, and helps overcome this natural drop in the output impedance and reduces the slope of the phase shift associated with the LC filter. In an example implementation, the L1/C1 output filter circuit may have a resonant frequency of about 45 kHz manifesting in a localized peak or bump in gain at this frequency. The LCR termination circuit 906 imposes a notch at this frequency to counteract this effect. The LCR circuit 1906 generally comprises at least one inductor-capacitor-resistor circuit in any appropriate configuration to attenuate or rectify the bump in gain caused by the L1/C1 resonant frequency. For example, the LCR circuit may be configured in a traditional series configuration, or in a high-pass filter configuration.

Figure 7:
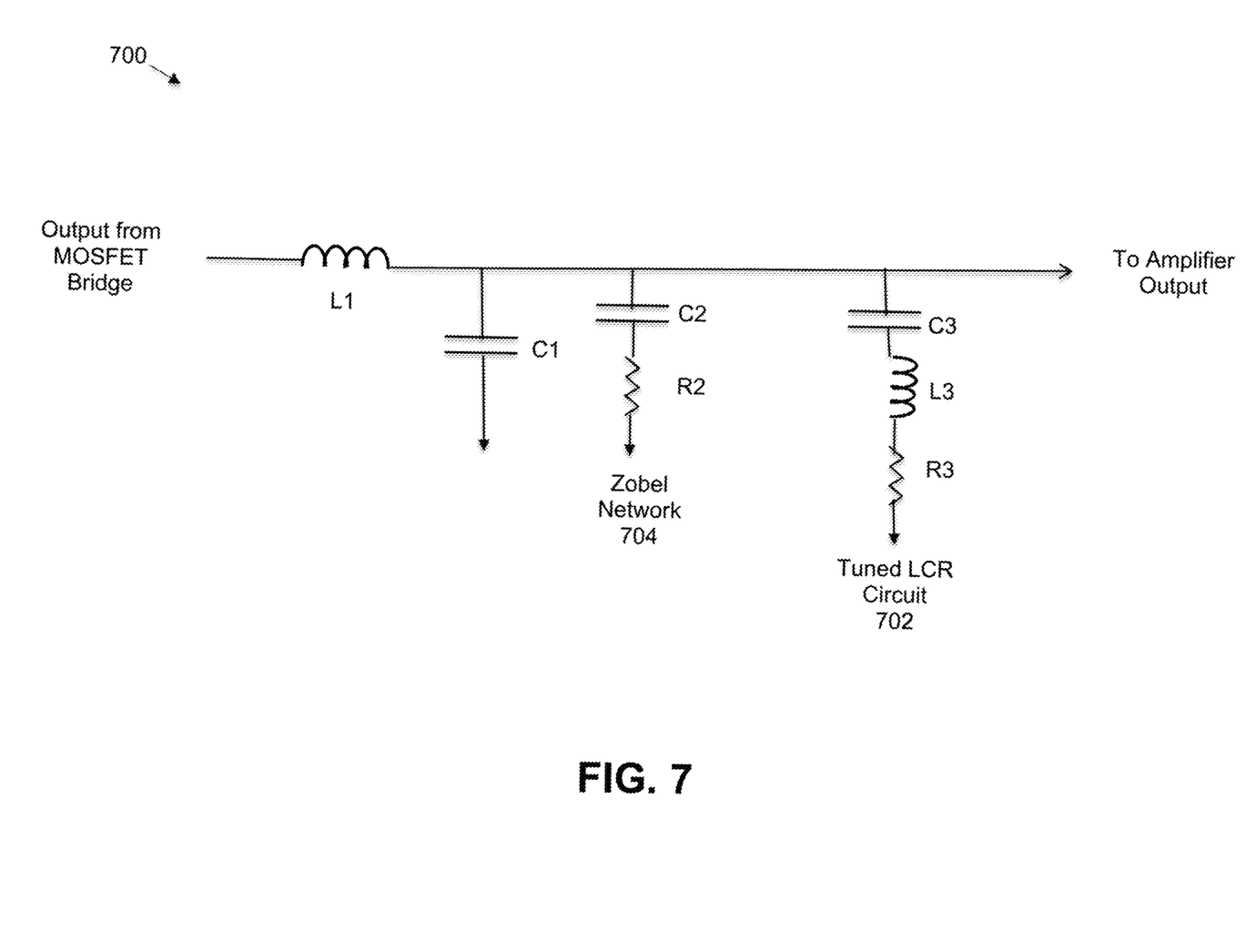
FIG. 7 illustrates an LCR termination circuit of FIG. 6 in a series configuration, under an embodiment.

FIG. 7 illustrates an LCR termination circuit of FIG. 6 in a series configuration, under an embodiment. As shown in circuit 700, the output of the transistor bridge (e.g., circuit 903 of FIG. 6) is coupled to the L1/C1 output filter circuit. The tuned LCR circuit comprising the termination circuit (e.g., circuit 106) comprises capacitor C3, inductor L3, and resistor R3 connected in series to ground as shown in FIG. 7. This is the final circuit stage before the speaker connector that comprises the amplifier output. For the embodiment of FIG. 7, the order of the LCR components is illustrated as CLR to ground, but other component orderings are also possible.

Figure 8:
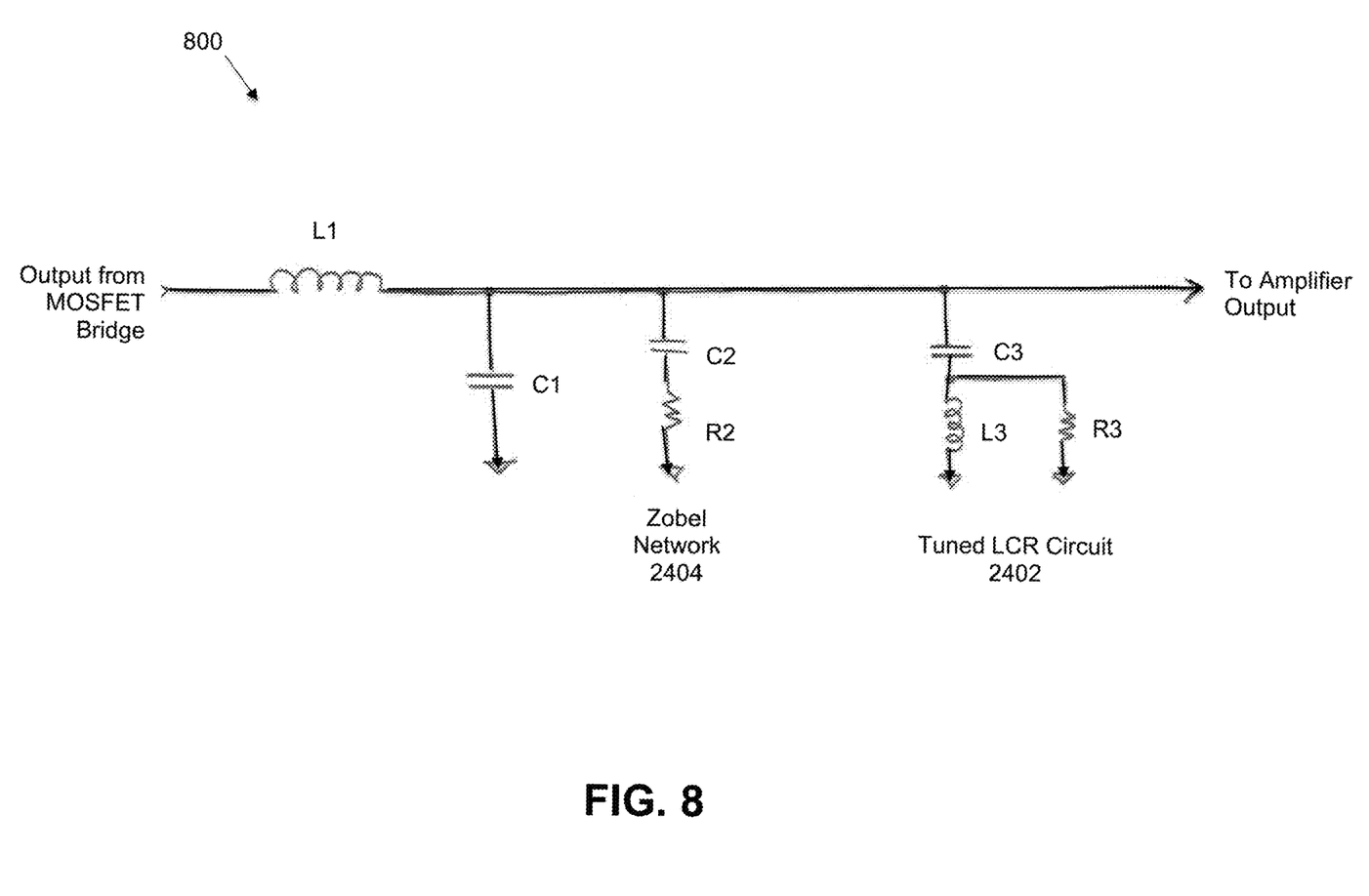
FIG. 8 illustrates an LCR termination circuit of FIG. 6 in a high-pass filter configuration, under an embodiment.

FIG. 8 illustrates an LCR termination circuit of FIG. 6 in a high-pass filter configuration, under an embodiment. For this embodiment, circuit 800 has a tuned LCR circuit 2402 comprising a capacitor C3 connected in series to a parallel array of inductor L3 and resistor R3. This configuration provides a tuned high-pass filter effect to counteract the resonant frequency of the L1/C1 output filter. As appreciated by those of ordinary skill in the art, the appropriate values and types of resistor, capacitor, and inductor devices may be selected depending on the characteristics of the L1/C1 output filter circuit and the amplifier in general. Although FIGS. 7 and 8 illustrate specific configurations of the LCR components, it should be noted that other configurations are also possible and can be tailored to provide the appropriate attenuation and/or filtering of the output filter resonance frequency.

The embodiments of FIGS. 7 and 8 both include an optional Zobel filter network 2304 or 2404 consisting of a capacitor C2 and a resistor R2 connected in series to ground. Such a circuit may or may not be included in the LCR termination circuit 906. In general, a Zobel network is a circuit in which the input impedance is set independently of the transfer function. In an amplifier application, the Zobel network (e.g., 2304) serves to present a steady resistance to the output LC filter at frequencies above the natural cutoff of the RC Zobel network. In general, the impedance of a speaker is partly resistive, but it also exhibits some degree of inductance due to the windings of its coil. The impedance of the loudspeaker is thus typically modelled as a series resistor and inductor. The Zobel network provides a parallel RC circuit to form a Zobel bridge that compensates for the LR impedance of the speaker and also helps to provide a high frequency termination when the amplifier is not connected to a loudspeaker or other similar load.

The embodiment of FIG. 6 also includes a high-frequency detection circuit 904. This circuit is configured to detect a high frequency condition at the output stage of the modulator stage 901. As shown in diagram 600, circuit 904 is coupled to an output of the termination circuit and is configured to provide feedback to the front end of circuit 600, to prevent the circuit from losing stability. In this configuration, it can also act to adjust the loop bandwidth of the modulator stage 901 by adjusting the characteristics of the transconductance amplifier (or current mirror, JFET circuit). In this configuration, the termination circuit with embedded high frequency detection circuit can detect the presence of high frequency oscillation and feed a control signal back to the loop bandwidth modulator, which in turn will lower the loop bandwidth and effectively eliminate the oscillation from sustaining for any length of time.

Figure 9:
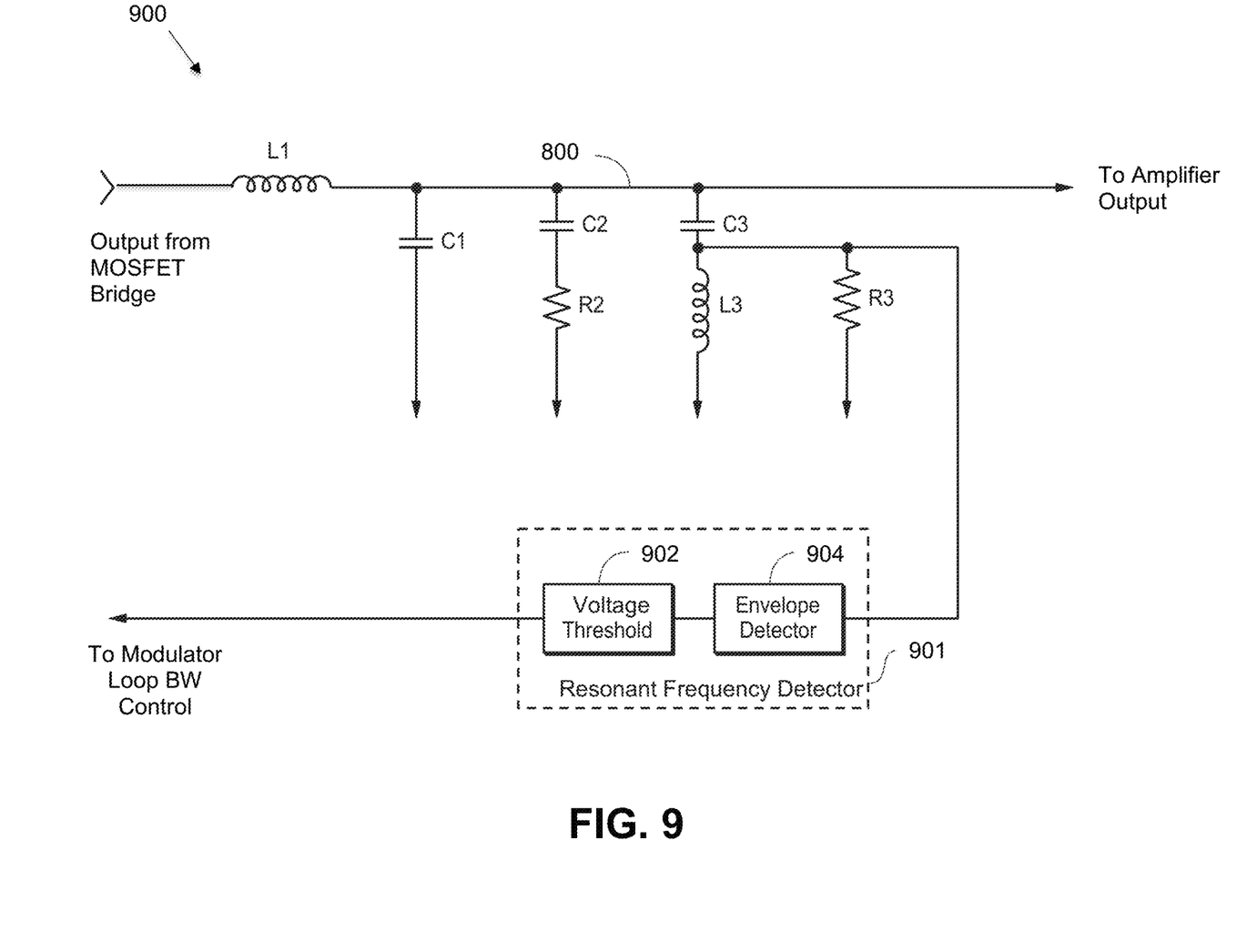
FIG. 9 illustrates a resonant frequency detection circuit for the termination circuit of FIG. 8, under an embodiment.

FIG. 9 illustrates a high-frequency detection circuit for the termination circuit of FIG. 8, under an embodiment. As shown in FIG. 9, circuit 900 is composed of the high-frequency detection circuit 800 of FIG. 8 with the addition of a resonant frequency detector circuit 901 coupled to an output node of the LRC filter made up of capacitor C3 coupled to inductor L3 and resistor R3. The resonant frequency detector 901 has an envelope detector 904 and a voltage threshold detector 902. The envelope detector 904 takes as an input the (high-frequency) signal from the LRC filter and provides an output which is the envelope of this input signal, which is a smooth curve outlining its extremes. This envelope signal is input to the voltage threshold detector, which compares the envelope to a defined threshold voltage level. If the threshold voltage is exceeded, this indicates the circuit outputting a signal at the resonant frequency of the L1/C1 output filter or an excessively high frequency on the output of the amplifier. The output of the voltage threshold detector is then sent as a modulator loop bandwidth control signal to alter the loop bandwidth. Alternatively, the output of the voltage threshold detector may be sent to a modulator control circuit to provide current limiting and/or other modulator control functions. Although shown in conjunction with termination circuit 800, it should be noted that the resonant frequency detector 901 can also be configured to operate with other types of termination circuits, such as the series RLC circuit 702 of FIG. 7, as well as other possible tuned LCR or tuned resonant frequency circuits that provide open load termination.

Embodiments described herein improve loop stability, increase reliability and usability over a broad range of application scenarios, and achieve a high level of audio performance by enhancing the feedback. Improving audio benchmarks such as harmonic distortion, cross-talk, frequency response, and signal-to-noise ratio, etc. has a direct impact on the acceptance and usability of the amplifier for a broad range of applications and markets. As a result of the novel loop bandwidth modulator with dynamic real-time adjustment of the loop transfer function, the carrier injection fixed frequency operation, tuned output filter termination with feedback, multiple loop feedback feed-forward architecture achieving dynamic loop compensation, the present invention solves many undesirable aspects of prior art closed loop Class-D amplifiers, and thus yields an amplifier that achieves excellent audio performance and maintains stability over a broad range of load and drive scenarios.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," and "hereunder" and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A circuit for stabilizing a Class-D audio amplifier comprising:
    a loop bandwidth modulator providing functionality to a pulse width modulator (PWM) and configured to modulate a loop bandwidth of the Class-D audio amplifier as a function of one or more control signals;
    a tuned output filter terminator coupled to a low-pass filter of the Class-D audio amplifier and configured to provide stabilizing control to the PWM; and
    a carrier injection system functionally coupled to the PWM and configured to provide a wide range fixed frequency operation and inject a clock signal after the loop bandwidth modulator.

2. The circuit of claim 1 wherein the loop bandwidth modulator dynamically controls a transfer function of the Class D audio amplifier including phase and frequency response with respect to the one or more control signals.

3. The circuit of claim 2 wherein the loop bandwidth modulator dynamically moves the poles of a main feedback loop filter through real-time continuous control modulation.

4. The circuit of claim 3 wherein the loop bandwidth modulator is controlled by at least one of an amplitude of an input audio signal or an amplitude of an output audio signal, such that as the amplitude increases, the loop bandwidth decreases; and as the amplitude decreases, the loop bandwidth increases.

5. The circuit of claim 1 wherein the loop bandwidth modulator is responsible for increasing and decreasing the phase response as a function of modulation index, and the carrier injection system is configured to provide synchronicity with an outside clock source by injecting a fixed-frequency periodic signal into the pulse width modulator stage, after a dynamically controlled integrator, and prior to a quantization comparator.

6. The circuit of claim 1 wherein the tuned output filter terminator is configured to feedback to the PWM to mitigate resonant output filter ringing and undamped oscillation.

7. The circuit of claim 6 wherein the tuned output filter terminator comprises:
    a tuned resistor-inductor-capacitor (RLC) circuit tuned to a resonant frequency of the low-pass filter of the Class-D audio amplifier; and
    a detection circuit configured to provide feedback to a prior stage of the PWM to provide a means to adjust a modulation index to maintain a minimum amount of stability.

8. The circuit of claim 1 further comprising a set of nested feedback loops coupling an input stage of the Class-D audio amplifier to each of an output of a modulator logic stage, a switching output stage, and the low-pass filter stage.

9. A Class-D amplifier comprising:
    an input circuit receiving an audio signal;
    a pulse-width modulator (PWM) logic stage coupled to the input circuit;
    a switching output stage coupled to the PWM logic stage;
    a passive low-pass filter coupled to the switching output stage;
    a first feedback loop coupling an output of the PWM logic stage to the input circuit;
    a second feedback loop coupling an output of the switching output stage to the input circuit;
    a third feedback loop coupling an output of the passive low-pass filter to the input circuit; and
    a carrier injection circuit injecting a clock signal into the PWM logic stage.

10. The Class-D amplifier of claim 9 further comprising a tuned output termination circuit coupled to the low-pass filter.

11. The Class-D amplifier of claim 9 further comprising a loop bandwidth modulator providing dynamic control of a transfer function of the amplifier loop and configured to increase a loop bandwidth by changing a respective frequency of loop filter poles, and decreasing a loop bandwidth by increasing a phase boost of the loop.

12. A method of stabilizing a feedback network within a Class-D amplifier, comprising:
    providing a first feedback loop coupling an output of a PWM logic stage of the Class-D amplifier to an input circuit of the amplifier;
    providing a second feedback loop coupling an output of a switching output stage of the Class-D amplifier to the input circuit;
    providing a third feedback loop coupling an output of a low-pass filter of the Class-D amplifier to the input circuit;
    providing a carrier injection circuit injecting a clock signal into the PWM logic stage; and
    providing a tuned output termination circuit coupled to the low-pass filter.

13. The method of claim 12 further comprising providing a loop bandwidth modulator providing dynamic control of a transfer function of the Class-D amplifier and configured to increase a loop bandwidth by changing a respective frequency of loop filter poles, and decreasing a loop bandwidth by increasing a phase boost of the Class-D amplifier.

* * * * *